(12) United States Patent
VanHoomissen et al.

(10) Patent No.: US 11,524,319 B2
(45) Date of Patent: Dec. 13, 2022

(54) APPARATUS AND METHOD FOR CLEANING WAFER HANDLING EQUIPMENT

(71) Applicant: KLA-Tencor Corporation, Milpitas, CA (US)

(72) Inventors: William VanHoomissen, San Jose, CA (US); Val Estrin, San Jose, CA (US); Eric Jong, Mountain View, CA (US)

(73) Assignee: KLA Corporation, Milpitas, CA (US)

( * ) Notice: Subject to any disclaimer, the term of this patent is extended or adjusted under 35 U.S.C. 154(b) by 603 days.

(21) Appl. No.: 15/649,471

(22) Filed: Jul. 13, 2017

(65) Prior Publication Data

US 2018/0021818 A1    Jan. 25, 2018

Related U.S. Application Data

(60) Provisional application No. 62/366,614, filed on Jul. 25, 2016.

(51) Int. Cl.
*B08B 1/04* (2006.01)
*H01L 21/67* (2006.01)
(Continued)

(52) U.S. Cl.
CPC .................. *B08B 1/04* (2013.01); *B08B 7/02* (2013.01); *H01L 21/67028* (2013.01);
(Continued)

(58) Field of Classification Search
CPC ......... H01L 21/67028; H01L 21/67023; H01L 21/02057; H01L 21/67046; H01L 21/02087; H01L 21/02096; H01L 21/02041; H01L 21/02043; H01L 21/02049; H01L 21/02082; H01L 21/67103; H01L 21/6735; H01L 21/67769; H01L 21/67775; H01L 21/68; H01L 21/68735; B08B 5/04; B08B 7/0071; B08B 1/04; B08B 7/02; A47L 11/10; A47L 13/20; A47L 13/24; A47L 13/254; A47L 13/25
(Continued)

(56) References Cited

U.S. PATENT DOCUMENTS 6,264,467 B1 * 7/2001 Lue ..................... C23C 16/4581
                                                        211/41.18
6,777,966 B1 * 8/2004 Humphrey ................ B08B 1/00
                                                             134/42
(Continued)

FOREIGN PATENT DOCUMENTS

JP    2016163007 A  *  9/2016
WO   2010120956 A2    10/2010

*Primary Examiner* — Laura C Guidotti
*Assistant Examiner* — Michael A Gump
(74) *Attorney, Agent, or Firm* — Suiter Swantz pc llo

(57) ABSTRACT

A cleaning assembly for cleaning one or more wafer edge handling contact surfaces of wafer handling equipment includes a substrate and a cleaning ring. The substrate includes an edge portion that extends about the body of the substrate. The cleaning ring is reversibly attachable to the edge portion of the substrate. The cleaning ring is formed from a deformable material. The substrate and cleaning ring are sized for compatibility with a front opening unified pod (FOUP) or a wafer cassette of a semiconductor fabrication facility.

20 Claims, 13 Drawing Sheets

(51) Int. Cl.
| | |
|---|---|
| *H01L 21/687* | (2006.01) |
| *B08B 7/02* | (2006.01) |
| *H01L 21/673* | (2006.01) |
| *H01L 21/677* | (2006.01) |
| *H01L 21/68* | (2006.01) |

(52) U.S. Cl.
CPC .... *H01L 21/6735* (2013.01); *H01L 21/67103* (2013.01); *H01L 21/67769* (2013.01); *H01L 21/67775* (2013.01); *H01L 21/68* (2013.01); *H01L 21/68735* (2013.01)

(58) Field of Classification Search
USPC ......................................................... 15/102
See application file for complete search history.

(56) References Cited

U.S. PATENT DOCUMENTS

| | | | |
|---|---|---|---|
| 2005/0191499 A1 | 9/2005 | Liu et al. | |
| 2006/0008660 A1 | 1/2006 | Parkhe | |
| 2008/0257383 A1 | 10/2008 | Levinson | |
| 2010/0258144 A1* | 10/2010 | Broz | B24B 37/34 |
| | | | 134/6 |
| 2014/0259478 A1* | 9/2014 | Conrad | A47L 11/4083 |
| | | | 15/98 |
| 2016/0145761 A1* | 5/2016 | Mayer | C23G 1/02 |
| | | | 134/26 |

\* cited by examiner

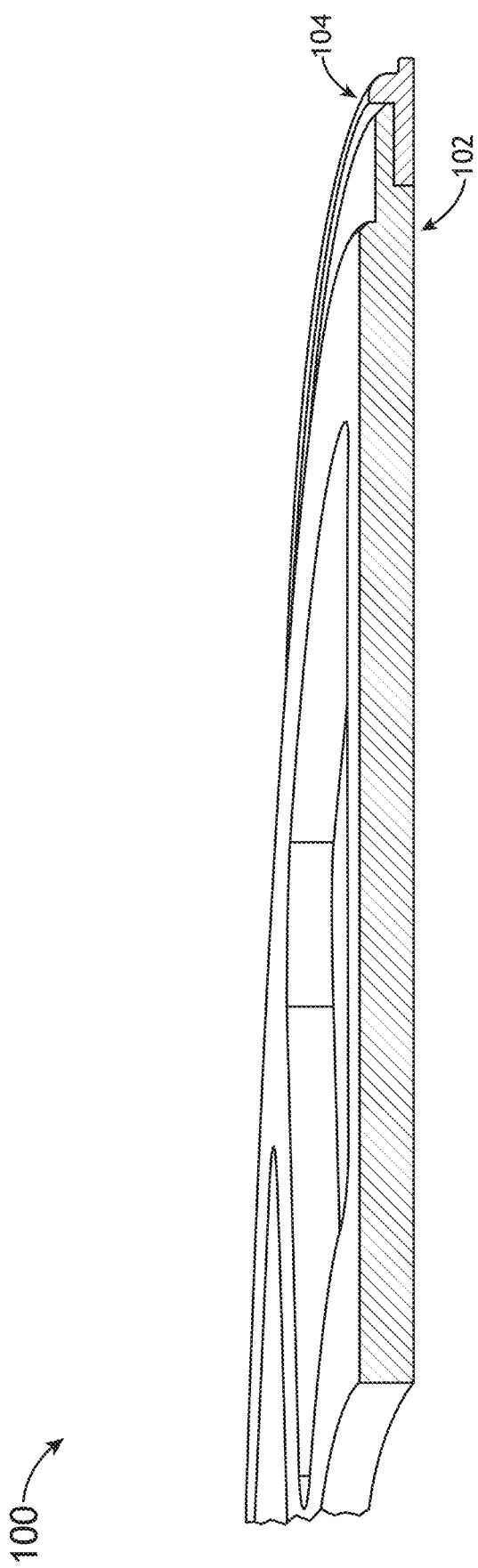

APPARATUS AND METHOD FOR CLEANING WAFER HANDLING EQUIPMENT

CROSS-REFERENCE TO RELATED APPLICATION

The present application claims the benefit under 35 U.S.C. § 119(e) of U.S. Provisional Application Ser. No. 62/366,614, filed Jul. 25, 2016, entitled EDGE-HANDLING-WAFER CONTACT CLEANING SUBSTRATE, naming William VanHoomissen, Val Estrin, and Eric Jong as inventors, which is incorporated herein by reference in the entirety.

TECHNICAL FIELD

The present invention generally relates to the cleaning of surfaces of wafer handling equipment and, in particular, to the non-intrusive cleaning of contact surfaces of wafer edge handling equipment.

BACKGROUND

As tolerances on semiconductor device fabrication processes continue to narrow, the demand for improved levels of contamination control within semiconductor device fabrication facilities increases. For example, in order to reduce contamination in a fabrication setting, contact surfaces of edge handling tools used to manipulate wafers as they traverse the fabrication line may be periodically cleaned. One such contamination control approach includes opening a given handling tool and manually cleaning the contact surfaces of the tool using various cleaning materials such as, but not limited to, alcohol and wipes or cleanroom swabs. Clean dry air (CDA) may also be employed to remove particulate contamination on handling tool surfaces. The manual cleaning of contact surfaces of handling tools is invasive and requires the tool be opened to access the contact surfaces. Opening a tool usually results in a time consuming (e.g., 12-24 hour) purge cycle before the tool can be put back into service. Therefore, it would be advantageous to provide an apparatus and method that cures the shortcomings identified in the previous approaches.

SUMMARY

A cleaning apparatus for cleaning one or more contact surfaces of wafer handling equipment is disclosed in accordance with one or more embodiments of the present disclosure. In one embodiment, the cleaning apparatus includes a substrate. In another embodiment, the substrate includes an edge portion extending about the body of the substrate. In another embodiment, the cleaning apparatus includes a cleaning ring. In another embodiment, the cleaning ring is reversibly attachable to the edge portion of the substrate. In another embodiment, the cleaning ring is formed from a deformable material. In another embodiment, the substrate is positionable within a front end opening unified pod (FOUP) device of a semiconductor device fabrication facility.

A method for cleaning one or more contact surfaces of wafer handling equipment is disclosed in accordance with one or more embodiments of the present disclosure. In one embodiment, the method includes providing a substrate, the substrate including an edge portion extending about the body of the substrate. In another embodiment, the method includes providing a cleaning ring formed from a deformable material. In another embodiment, the method includes attaching the cleaning ring to the substrate. In another embodiment, the method includes disposing the substrate within a front end opening unified pod of a semiconductor device fabrication facility. In another embodiment, the method includes transferring the front end opening unified pod between one or more process tools of the semiconductor facility. In another embodiment, the method includes cleaning one or more contact surfaces of one or more wafer handling devices of the semiconductor device fabrication facility with the cleaning ring attached to the substrate.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and, together with the general description, serve to explain the principles of the invention.

BRIEF DESCRIPTION OF THE DRAWINGS

The numerous advantages of the disclosure may be better understood by those skilled in the art by reference to the accompanying figures in which:

FIG. 1D is cross-sectional view of the cleaning assembly including the substrate and the cleaning ring, in accordance with one or more embodiments of the present disclosure.

DETAILED DESCRIPTION OF THE INVENTION

Reference will now be made in detail to the subject matter disclosed, which is illustrated in the accompanying drawings.

Referring generally to FIGS. 1A through 6, an apparatus and method for cleaning one or more contact surfaces of wafer handling equipment of a semiconductor device fabrication facility is described in accordance with the present disclosure.

Embodiments of the present disclosure are directed to a cleaning assembly including a substrate and a cleaning ring formed from a deformable material. The cleaning assembly of the present disclosure provides for the non-intrusive cleaning of surfaces that contact silicon substrates in semiconductor manufacturing equipment of a semiconductor device fabrication facility. Wafer contact surfaces can become contaminated with particulate and molecular contamination. It is noted that metallic contamination is increasingly a focus of wafer and semiconductor device manufacturers. Embodiments of the present disclosure provide a method and device to quickly and inexpensively reduce metallic contamination within tools that handle wafers by the edges.

Figure 1A:
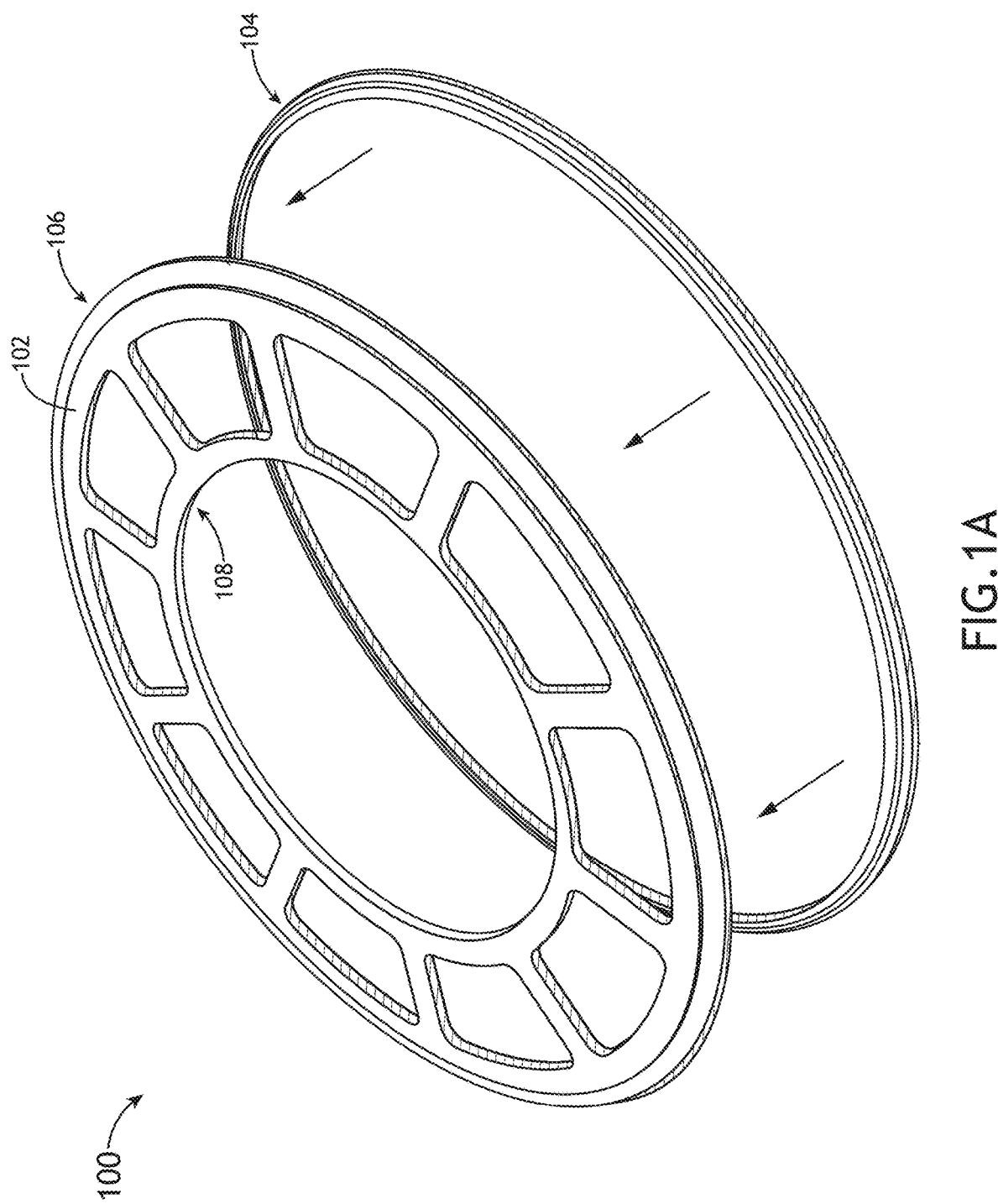
FIG. 1A is an exploded view of a cleaning assembly including a substrate and a cleaning ring, in accordance with one or more embodiments of the present disclosure.

FIG. 1A illustrates an exploded view of a cleaning assembly 100 for cleaning one or more contact surfaces of wafer handling equipment, in accordance with one or more embodiments of the present disclosure. In one embodiment, the cleaning assembly 100 includes a substrate 102. In another embodiment, the cleaning assembly 100 includes a cleaning ring 104. In one embodiment, the substrate 102 includes an edge portion 106 extending around the body 108 of the substrate 102. In another embodiment, the cleaning ring 104 is configured for being reversibly attached to the edge portion 106 of the substrate 102.

Figure 1B:
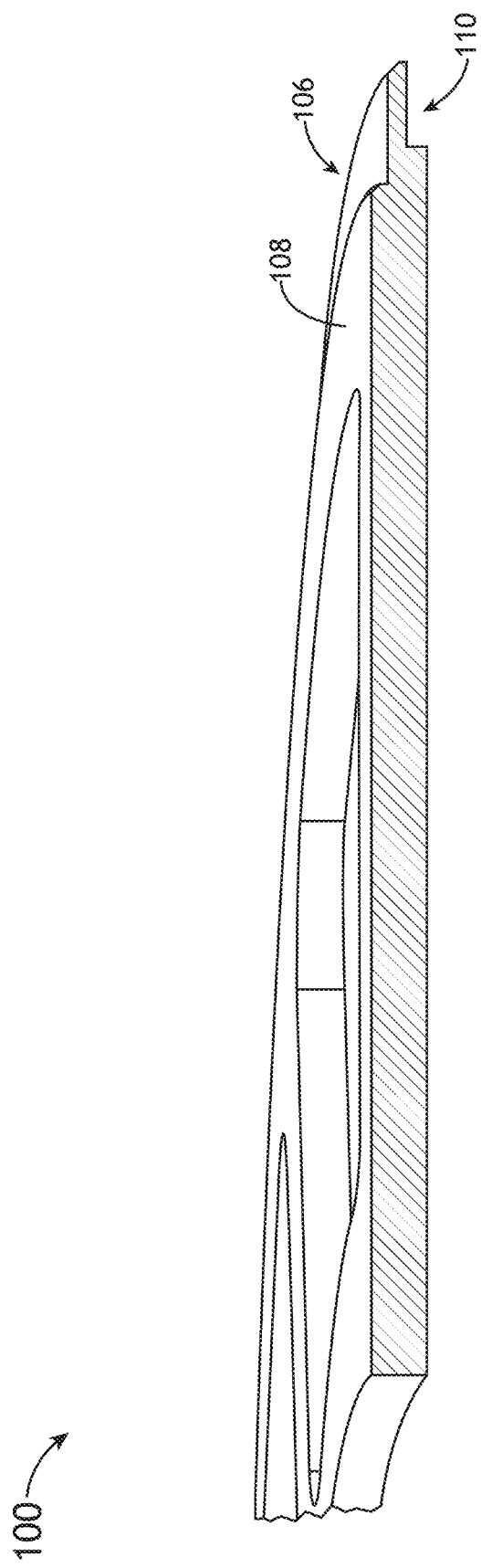
FIG. 1B is a cross-sectional view of the substrate of the cleaning assembly, in accordance with one or more embodiments of the present disclosure.

The cleaning ring 104 may be attached to the substrate 102 in any suitable manner. In one embodiment, as shown in FIG. 1B, the edge portion 106 of the substrate 102 may include a notched external edge 110. For example, the notched edge 110 may include a bezel. Similarly, the cleaning ring 104 may include a notched internal edge 112 compatible with the notched external edge 110 or bezel of the substrate 102. In this regard, the cleaning ring 104 may be attached to the substrate 102 such that notched internal edge 112 of the cleaning ring 104 fits to the notched external edge 110 of the substrate 102 the surface of the substrate 102 and the surface of the cleaning ring 104 are substantially flush.

Figure 1C:
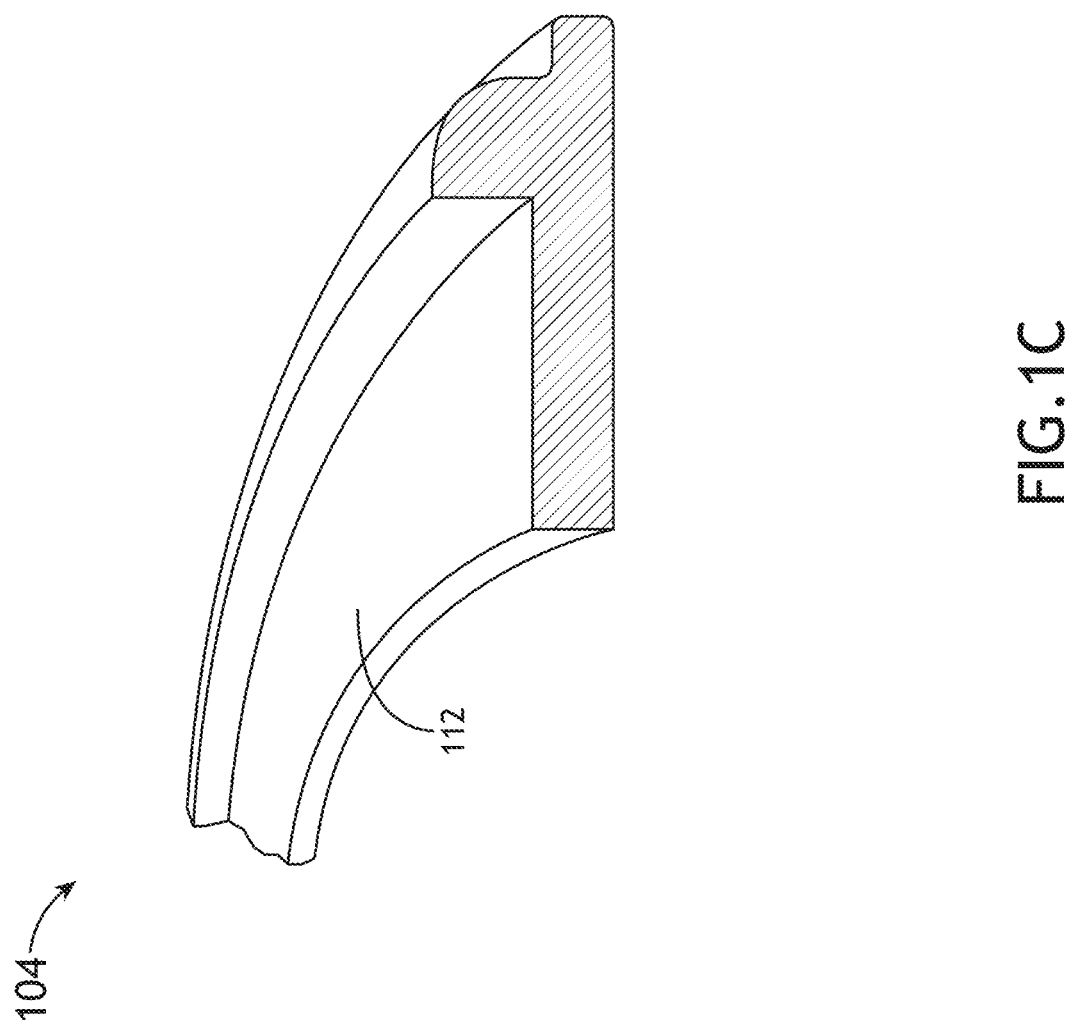
FIG. 1C is a cross-sectional view of the cleaning ring of the cleaning assembly, in accordance with one or more embodiments of the present disclosure.

For instance, as depicted in FIG. 1B, the notched external edge 110 of the substrate 102 may be disposed on the bottom surface of the substrate 102. Further, as shown in FIG. 1C, the notched internal edge 112 of the cleaning ring 104 may be disposed on the top portion of the cleaning ring 104. In this regard, as shown in FIG. 1D, the cleaning ring 104 may be attached to the bottom surface of substrate 102 such that bottom surface of the substrate 102 and the bottom surface of the cleaning ring 104 are substantially flush.

Such a configuration is particular useful in cleaning vertical contact surfaces and/or horizontal contact surfaces of edge handling equipment. Additionally, the cleaning ring includes a notched external edge including a horizontal surface and a vertical surface, wherein the horizontal surface extends outward from the vertical surface.

In another embodiment, the cleaning assembly 100 is configured to be handled by the wafer handling equipment in the same manner that wafers are handled by the equipment. The substrate 102 may be formed from any material known in the art. For example, the substrate 102 may be formed from a rigid material, such as, but not limited to, a metal, a plastic, a composite material or carbon fiber. The substrate 102 may be constructed to have any selected size. For instance, the substrate 102 may be constructed to have a size that is equivalent to the size of the semiconductor wafers compatible with the particular semiconductor fabrication facility. For example, the substrate 102 may be constructed to have a 200, 300, or 450 mm diameter, which are wafer sizes commonly used in semiconductor device fabrication processes.

In one embodiment, the cleaning ring 104 of the assembly 100 may be configured for interacting with one or more contact surfaces of any wafer handling equipment known in the art. For example, the cleaning ring 104 may be configured for interacting with one or more vertical and/or horizontal contact surfaces of an edge handling robot, an aligner, a gripper, and the like.

In one embodiment, the cleaning ring 104 is formed from a deformable and/or soft material that is low in metal content. The deformable material of the cleaning ring 104 may deform when handled by the one or more contact surfaces of the wafer handling equipment. The deformation of the cleaning ring 104 causes mechanical action (e.g., scrubbing action) on the one or more contact surfaces of the wafer handling equipment. Further, in cases where the cleaning ring 104 is also soft, the cleaning ring 104 may capture contaminates that are removed from a given contact surface of the wafer handling equipment. In addition, the cleaning ring 104 may be coated with an adhesive or tacky material, which aids in capturing contaminant particles. The cleaning ring 104 may be formed from any deformable and/or soft material known in the art. For example, the cleaning ring 104 may be formed from, but is not limited to, a rubber, plastic, and/or an adhesive. For instance, the cleaning ring 104 may be formed from, but is not limited to, one or more perfluoroelastomer materials. In another embodiment, the cleaning ring 104 may be patterned or textured. Patterning or texturing the cleaning ring 104 may cause the cleaning ring 104 to be more effective at removing contaminants from the various contact surfaces of the wafer handling equipment.

Figure 1E:
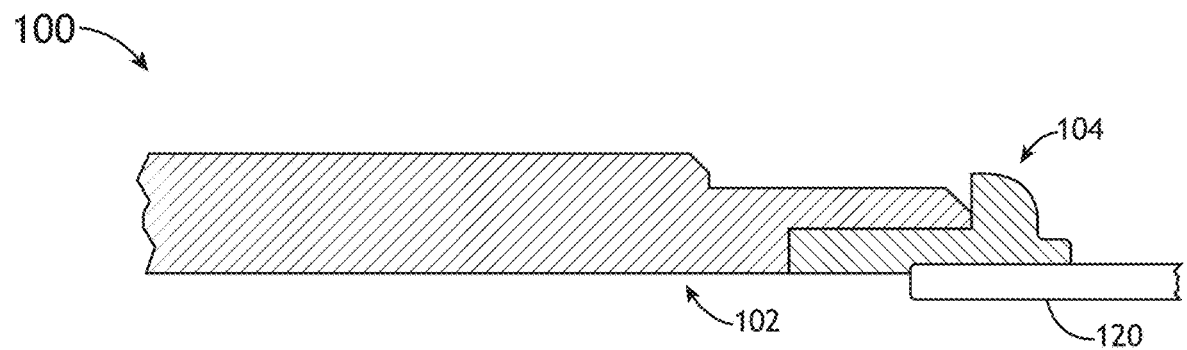
FIG. 1E is cross-sectional view of the cleaning assembly depicting the interaction of the cleaning ring with a horizontally oriented contact surface of wafer handling equipment, in accordance with one or more embodiments of the present disclosure.
Figure 1F:
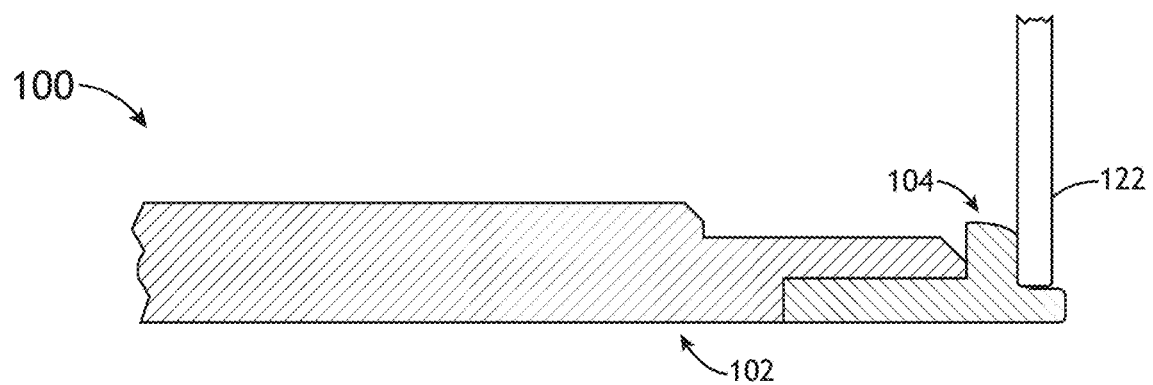
FIG. 1F is cross-sectional view of the cleaning assembly depicting the interaction of the cleaning ring with a vertically oriented contact surface of wafer handling equipment, in accordance with one or more embodiments of the present disclosure.

FIGS. 1E and 1F illustrate conceptual views of one or more contact surfaces of a wafer handling equipment interacting with the cleaning ring 104, in accordance with one or more embodiments of the present disclosure. In one embodiment, as shown in FIG. 1E, the cleaning assembly 100 may be used to clean one or more horizontal contact surfaces 120 of wafer handling equipment positioned below the cleaning assembly 100. In another embodiment, the cleaning assembly 100 may be used to clean one or more horizontal contact surfaces 120 of wafer handling equipment positioned above the cleaning assembly 100. For example, horizontal contact surfaces positioned above the cleaning assembly 100 may be present in tools that tilt wafers away from the horizontal. In another embodiment, as shown in FIG. 1F, the cleaning assembly 100 may be used to clean one or more vertical contact surfaces 122 of wafer handling equipment. In another embodiment, the cleaning ring 104 may be constructed such that a cross-section of the cleaning ring 104 provides for contact with both vertically oriented contact surfaces and horizontally oriented contact surfaces.

Figure 1G:
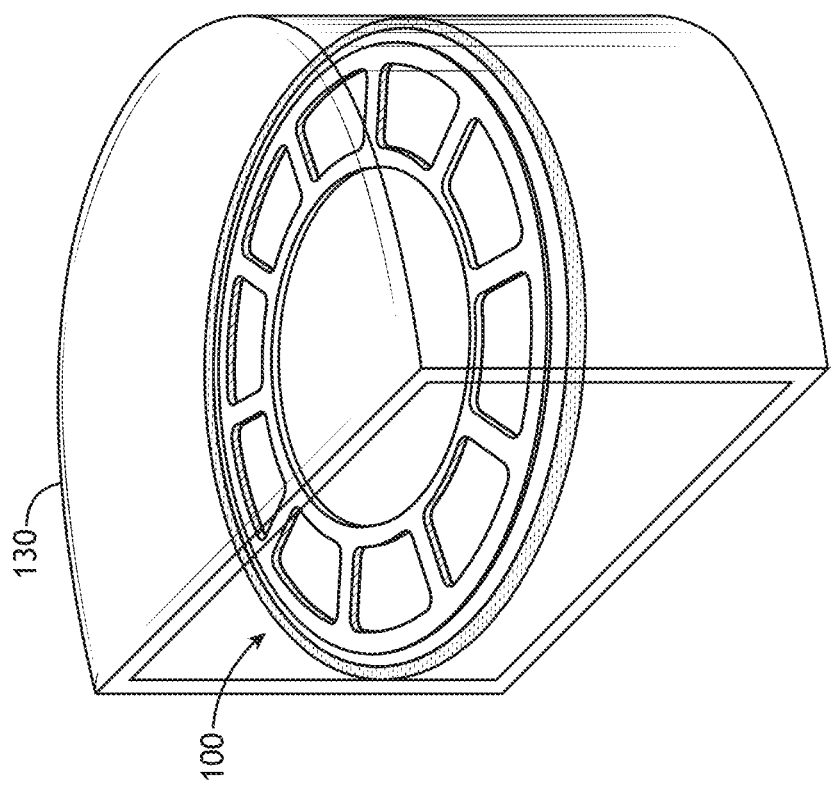
FIG. 1G is a schematic view of the cleaning assembly disposed within a front opening unified pod (FOUP) of a semiconductor device fabrication facility, in accordance with one or more embodiments of the present disclosure.

In another embodiment, the cleaning assembly 100 is configured for carriage in a sealable container used to transfer wafers through the various process steps of a semiconductor fabrication facility. For example, the sealable container may include, but is not limited to, a front opening unified pod (FOUP) or a wafer cassette. FIG. 1G illustrates a simplified schematic view of the cleaning assembly 100 disposed within a FOUP 130, in accordance with one or more embodiments of the present disclosure. The cleaning assembly 100 may be shaped such that it appears to be a wafer to the FOUP/cassette mapper of the semiconductor manufacturing equipment of the facility. In one embodiment, the cleaning assembly 100 may be stored in a FOUP or cassette in the same manner as other tooling wafers. As part of routine tool support or daily qualification, the cleaning assembly 100 may be cycled through the semiconductor device manufacturing equipment to maintain a baseline level of cleanliness. Alternately, the cleaning assembly 100 could be employed as a response to an excursion and used when the tool cleanliness fails specifications.

In another embodiment, the cleaning assembly 100 may be formed of materials which are compatible with one or more wafer cleaning processes. For example, the materials used to form the substrate 102 and/or cleaning ring 104 may be compatible (i.e., do not degrade) when exposed to the various silicon cleaning procedures (e.g., wet chemical cleaning, dry cleaning, mechanical cleaning, ultrasonic cleaning, and the like) known in the art of wafer processing.

Figure 2A:
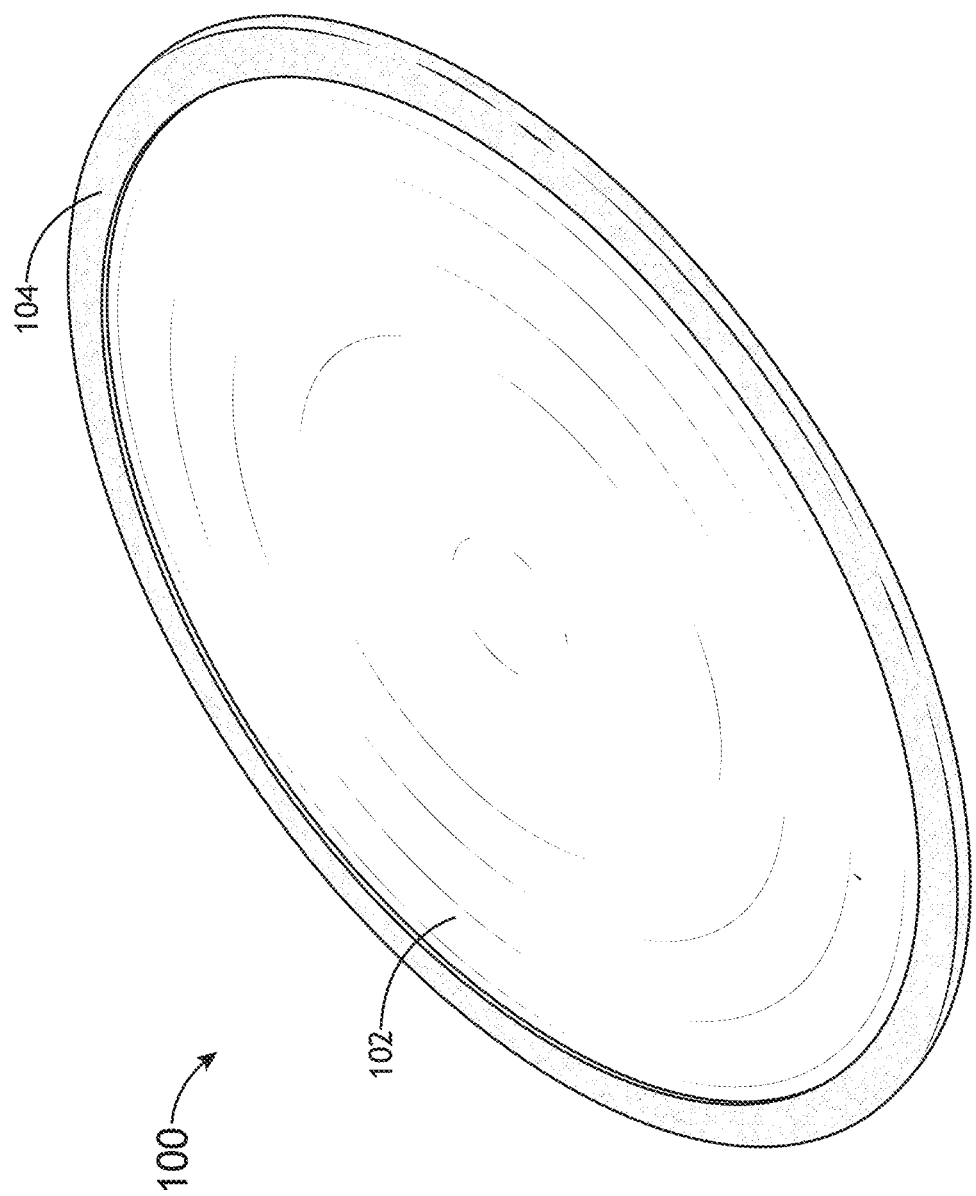
FIG. 2A is a schematic view of a cleaning assembly including a substrate and a cleaning ring, in accordance with one or more embodiments of the present disclosure.
Figure 2B:
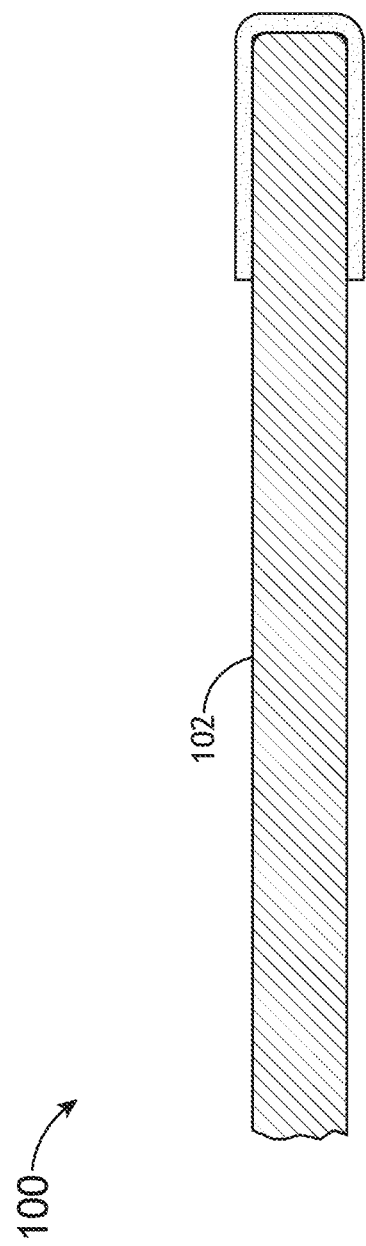
FIG. 2B is a cross-sectional view of a cleaning assembly including a substrate and a cleaning ring, in accordance with one or more embodiments of the present disclosure.

While much of the present disclosure has focused on a ring-shaped substrate 102 and a notched cleaning ring 104(e.g., see FIG. 1A), such a configuration is not a limitation on the scope of the present disclosure and is provided merely for purposes of illustration. FIGS. 2A and 2B illustrate the cleaning assembly 100, in accordance with one or more alternative and/or additional embodiments of the present disclosure. In one embodiment, as shown in FIGS. 2A and 2B, the substrate 102 may have a disk shape and the cleaning ring 104 may include a ring of deformable material (e.g., rubber, plastic, or adhesive) that fits over the edge portion of the disk-shaped substrate 102. In one embodiment, the cleaning ring 104 is configured to fit over the edge portion of the substrate 102 and is secured to the substrate 102 via the compressive force of the deformable material of cleaning ring 104 on the substrate 102. It is noted that securing the cleaning ring 104 via compression force of the deformable material is not limited to implementation with the disk-shaped substrate 102 of FIG. 2A, but may generally be extended to any of the various substrate types and shapes described throughout the present disclosure.

Figure 3B:
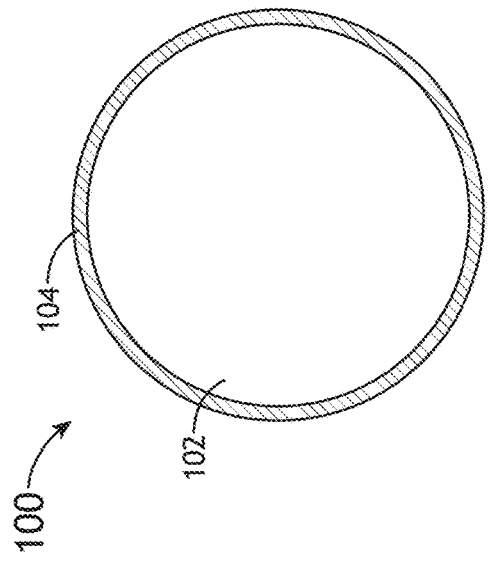
FIGS. 3A-3C are top views of various cleaning assembly configurations, in accordance with one or more embodiments of the present disclosure.
Figure 3C:
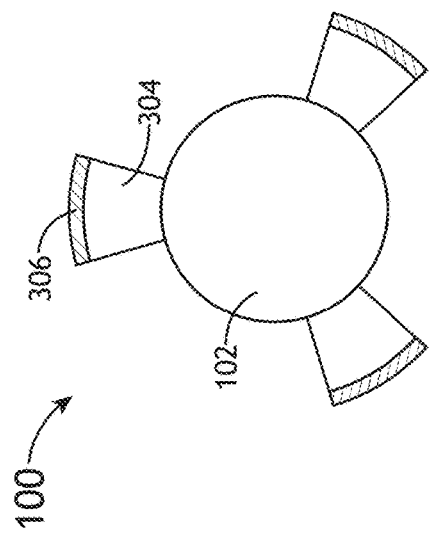
Figure 3A:
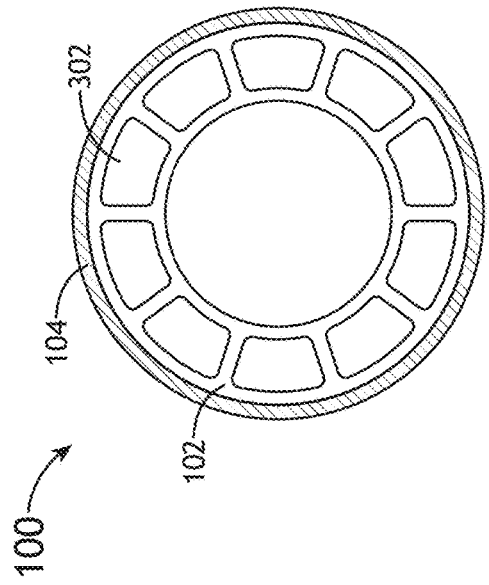

FIGS. 3A-3C depict simplified top views of various configurations of the cleaning assembly 100, in accordance with one or more embodiments of the present disclosure. In one embodiment, depicted in FIG. 3A and described previously herein, the cleaning assembly 100 may include a ring-shaped substrate 102 and a cleaning ring 104, which fits around the edge of the substrate 102. In this embodiment, the substrate 102 may have a spoked ring shape, which may significantly reduce the weight of the cleaning assembly 100 (e.g., below the weight of a silicon wafer). In another embodiment, depicted in FIG. 3B and described previously herein, the cleaning assembly 100 may include a disk-shaped substrate 102 and a cleaning ring 104, which fits around the edge of the substrate 102. In another embodiment, depicted in FIG. 3C, the cleaning assembly 100 may include a non-circular substrate 102 including a set of protrusions 304. The protrusions 304 may take on any number of shapes, such as, but not limited to, circular/ring sections (shown in FIG. 3C), trapezoids, triangles, and the like. Further, the cleaning assembly 100 may include a set of cleaning segments 306 instead of the cleaning ring 104 described previously herein. It is noted that the scope of the present disclosure is not limited to the configurations depicted and described above. Rather, it is contemplated herein that the cleaning assembly 100 of the present disclosure may include a substrate 102 and cleaning ring/segments 104, 306 of any shape.

In another embodiment, although not shown, rather than mechanically attaching a cleaning ring 104 to the substrate 102, the substrate 102 may be coated with a deformable material. For example, the substrate 102, such as a ring-shaped or disk-shaped substrate 102, may be partially or entirely coated with a deformable material (e.g., rubber, plastic, or adhesive). For instance, the cleaning assembly 100 may include, but is not limited to, a silicon wafer coated partially or entirely with a deformable material, such as a plastic, rubber, or adhesive material.

Figure 4A:
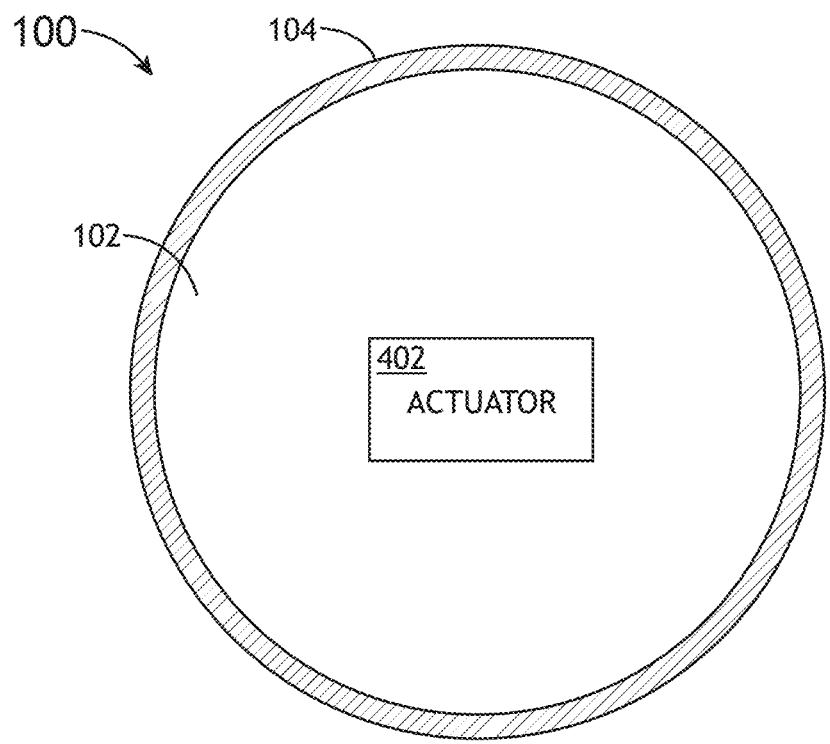
FIGS. 4A-4B are simplified schematic views of the cleaning assembly equipped with one or more actuators, in accordance with one or more embodiments of the present disclosure.
Figure 4B:
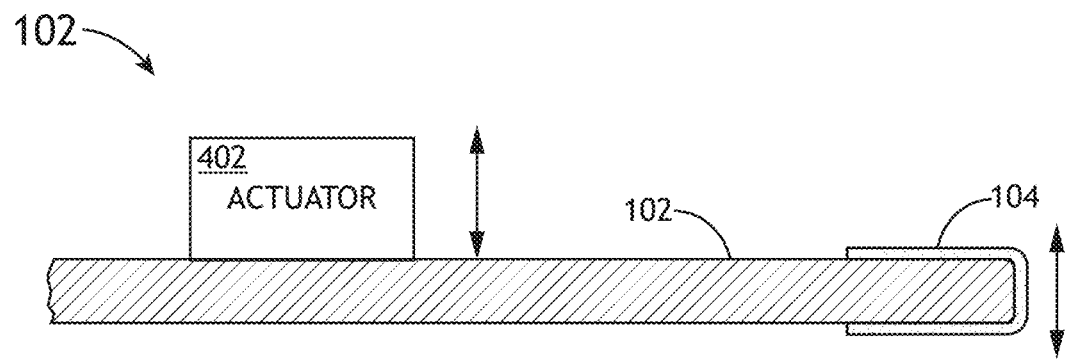

FIGS. 4A and 4B illustrate the cleaning assembly 100 equipment with an actuator 402, in accordance with one or more embodiments of the present disclosure. FIG. 4A depicts a simplified top view of the cleaning assembly 100 equipped with the actuator 402. In this embodiment, the actuator 402 may be disposed at a selected location of substrate 102. As shown in FIG. 4B, as the actuator 402 vibrates it causes vibration of the substrate 102 such that there is horizontal and/or vertical motion to the edge portion of the substrate 102. This vibration causes the cleaning ring 104 to also vibrate, which may assist in removing contaminants from the contact surfaces of the wafer handling equipment. In FIG. 4A, the actuator 402 is depicted as a single device located at the center region of the substrate 102. It is noted that such a configuration is not a limitation on the scope of the present disclosure. For example, the cleaning assembly 100 may include, but is not limited to, a number of actuator devices 402 disposed at various locations across the substrate 102. The actuator 402 may include any actuator device known in the art including, but not limited to, one or more piezoelectric actuators. In addition, although not shown, the cleaning assembly 100 may include a suitable energy supply (e.g., onboard battery) connected to the actuator 402 and control circuitry configured for controlling the actuator 402 based on command instructions received from one or more external devices (e.g., controller including a user interface to receive commands from a user to activate/deactivate the actuator 402).

Figure 5A:
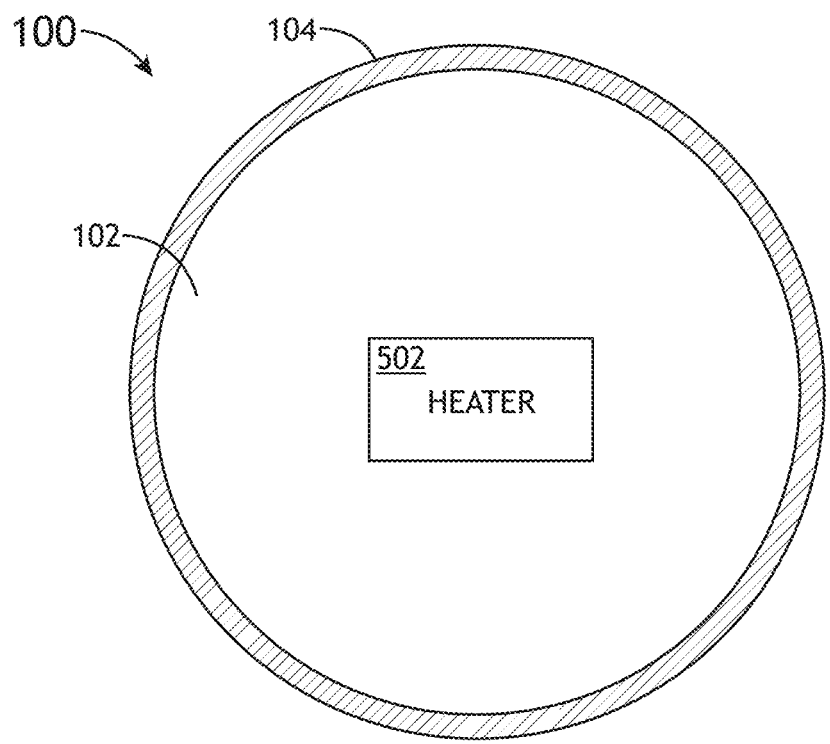
FIGS. 5A-5B are simplified schematic views of the cleaning assembly equipped with one or more heaters, in accordance with one or more embodiments of the present disclosure.
Figure 5B:
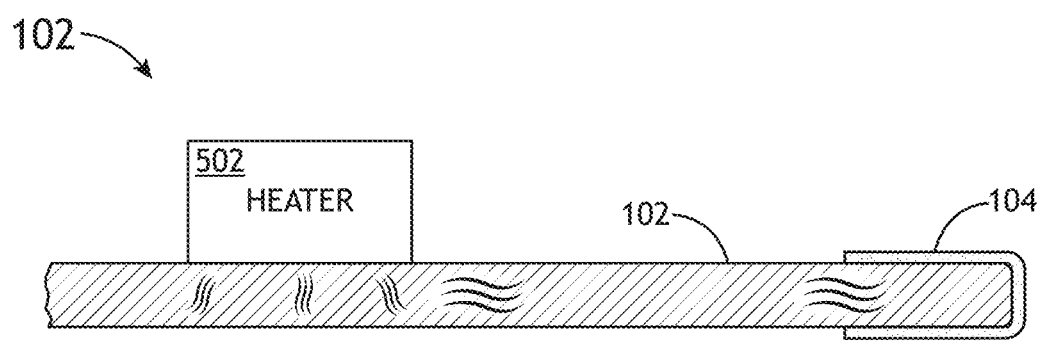

FIGS. 5A and 5B illustrate the cleaning assembly 100 equipment with a heater 502, in accordance with one or more embodiments of the present disclosure. FIG. 5A depicts a simplified top view of the cleaning assembly 100 equipped with the heater 502. In this embodiment, the heater 502 may be disposed at a selected location of substrate 100. As shown in FIG. 5B, as the heater 502 generates heat the substrate 102 conducts thermal energy to the outer edge region of the substrate 102, which also causes the cleaning ring 104 to be heated. The heating of the cleaning ring 104 may assist in removing contaminants from the contact surfaces of the wafer handling equipment. In FIG. 5A, the heater 502 is depicted as a single device located at the center region of the substrate 102. It is noted that such a configuration is not a limitation on the scope of the present disclosure. For example, the cleaning assembly 100 may include, but is not limited to, a number of heaters 502 disposed at various locations across the substrate 102. In another embodiment, the substrate 102 may include one or more conduction lines/segments (e.g., metal lines or metal pathways) configured to conduct thermal energy to desired locations along the edge of the substrate 102. The heater 502 may include any heater device known in the art including, but not limited to, one or more resistive heaters. In addition, although not shown, the cleaning assembly 100 may include a suitable energy supply (e.g., onboard battery) connected to the heater 502 and control circuitry configured for controlling the heater 502 based on command instructions received from one or more external devices (e.g., controller including a user interface to receive commands from a user to activate/deactivate the heater 502).

Figure 6:
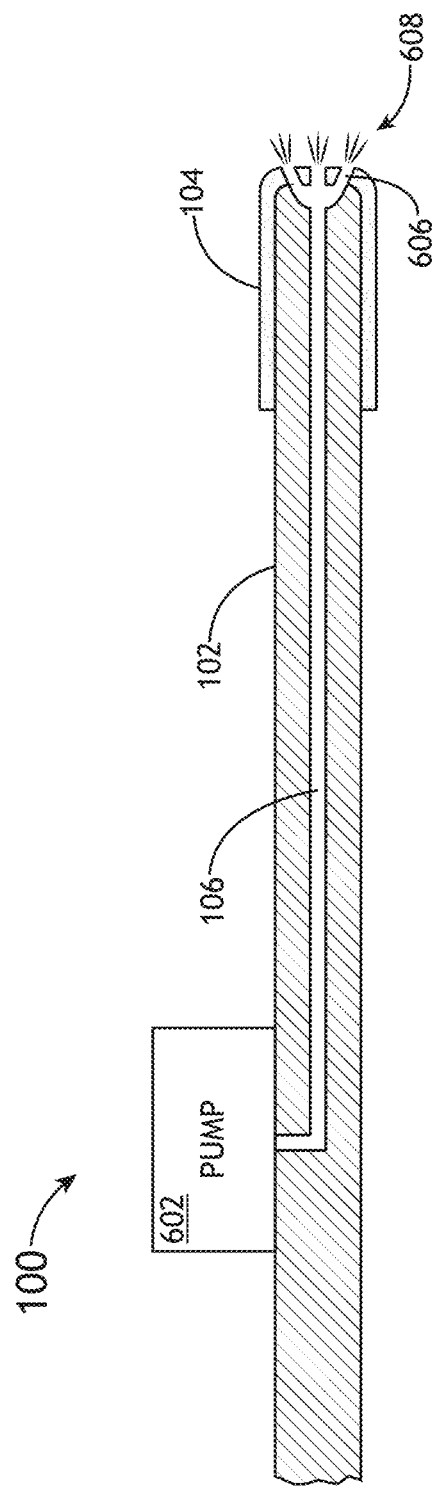
FIG. 6 is a simplified schematic view of the cleaning assembly including a set of manifolds for providing airflow at the edge portion of the substrate of the cleaning assembly, in accordance with one or more embodiments of the present disclosure.

FIG. 6 illustrates the cleaning assembly 100 equipped with a pump 602, in accordance with one or more embodiments of the present disclosure. In one embodiment, the substrate 102 may include one or more channels 106 for providing airflow between the pump 602 and the edge of the substrate 102. In one embodiment, as shown in FIG. 6, the one or more channels 106 may be formed within the body of the substrate 102. In another embodiment, although not shown, the one or more channels 106 may be embodied as one or more pipes or tubes disposed on the surface of the substrate 102. In another embodiment, the edge of the substrate 102 may include a set of manifolds to allow for air (or other selected gas) to exit or enter the edge portion of the substrate 102 and toward the pump 602. In one embodiment, the pump 602 may be configured as a blower to provide pressurized airflow to the edge portion of the substrate 102. In another embodiment, the pump 602 may be configured as a slight vacuum pump to provide intake airflow at the edge portion of the substrate 102. It is noted that outgoing/ingoing airflow at the edge portion of the substrate 102 may aid in removing contaminants from one or more contact surfaces of the wafer handling equipment. It is noted that the manifolds may be formed in any manner known in the art, such as, but not limited to, three-dimensional printing.

Figure 7:
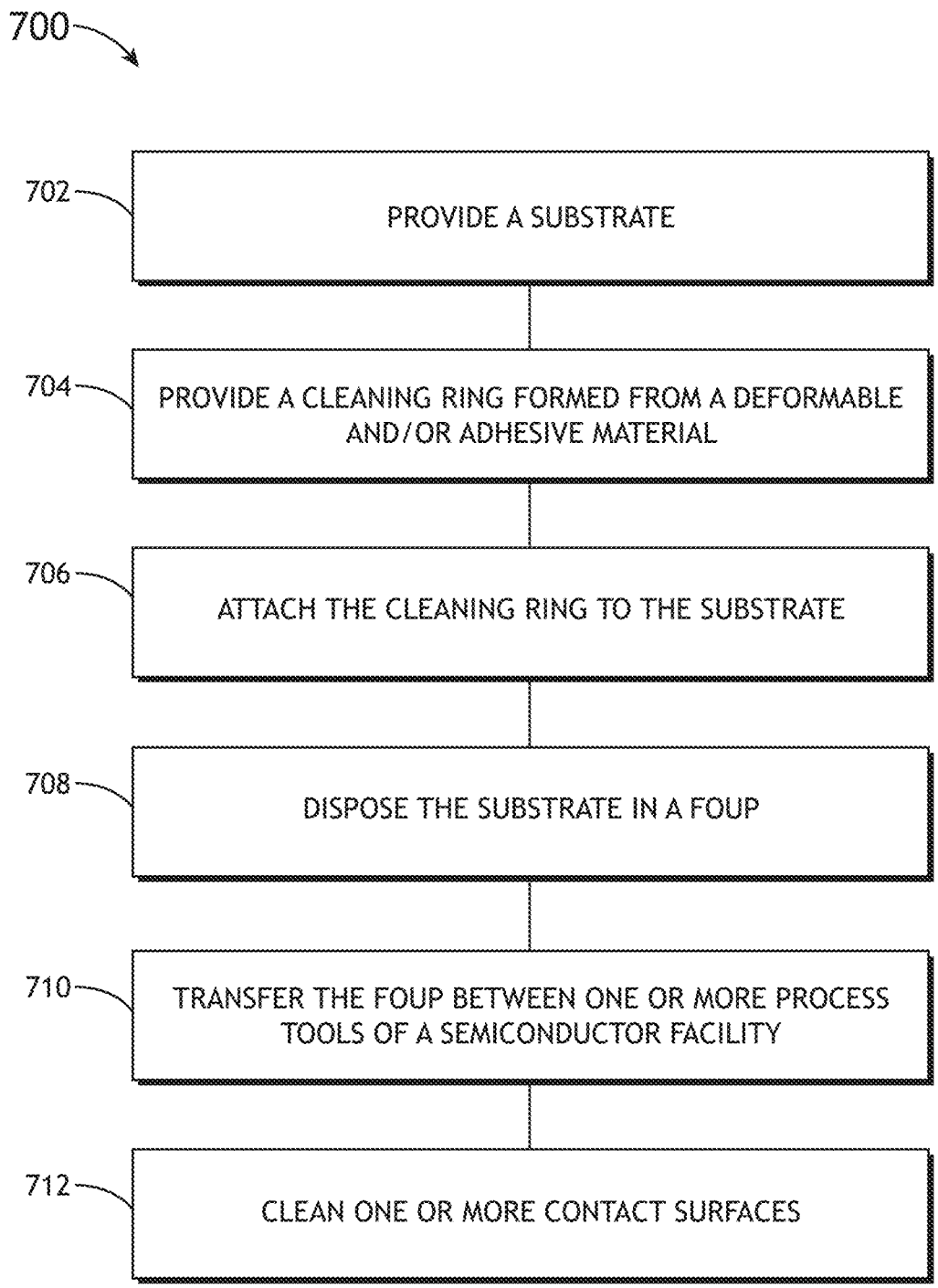
FIG. 7 illustrates a process flow diagram depicting a method for cleaning wafer handling equipment of a semiconductor device facility, in accordance with one or more embodiments of the present disclosure

FIG. 7 illustrates a process flow diagram depicting a method 700 for cleaning wafer handling equipment of a semiconductor device facility, in accordance with one or more embodiments of the present disclosure.

In step 702, a substrate is provided. The substrate may include an edge portion extending about the body of the substrate. In step 704, a cleaning ring formed from a deformable material is provided. In step 706, the cleaning ring is attached to the substrate. In step 708, the substrate, with the attached cleaning ring, is disposed within a front end opening unified pod (FOUP) of a semiconductor device fabrication facility. In step 710, the FOUP is transferred between one or more process tools of the semiconductor facility. In step 712, one or more contact surfaces of one or more wafer handling devices of the semiconductor device fabrication facility are cleaned with the cleaning ring of the substrate contained within the FOUP.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include, but are not limited to, physically mateable and/or physically interacting components, and/or wirelessly interactable and/or wirelessly interacting components, and/or logically interacting and/or logically interactable components.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. An apparatus comprising:
    a substrate, the substrate including a notched external edge encircling an outside circumference of the substrate; and
    a cleaning ring, the cleaning ring including a notched internal edge encircling an inside circumference of the cleaning ring, wherein the notched internal edge of the cleaning ring is shaped to fit to the notched external edge of the substrate, wherein the cleaning ring is reversibly attached to the substrate via the notched external edge of the substrate and the notched internal edge of the cleaning ring, wherein the cleaning ring is formed from a deformable material, wherein the cleaning ring includes a notched external edge including a horizontal surface and a vertical surface, wherein the horizontal surface extends outward from the vertical surface.

2. The apparatus of claim 1, wherein the deformable material of the cleaning ring is coated with an adhesive material.

3. The apparatus of claim 1, wherein the substrate has a ring shape.

4. The apparatus of claim 3, wherein the substrate includes a plurality of spokes.

5. The apparatus of claim 1, wherein the substrate has a disk shape.

6. The apparatus of claim 1, wherein the notched internal edge of the cleaning ring corresponds with the notched external edge of the substrate such that a bottom surface of the cleaning ring is flush with a bottom surface of the substrate when the cleaning ring is attached to the substrate.

7. The apparatus of claim 1, wherein the substrate and cleaning ring are sized for compatibility with at least one of a front opening unified pod (FOUP) or wafer cassette of a semiconductor fabrication facility.

8. The apparatus of claim 1, further comprising:
    an actuator disposed on the substrate, wherein the actuator is configured to produce vibrations within the substrate such that the cleaning ring is actuated at least partially in at least one of a horizontal or vertical direction.

9. The apparatus of claim 1, further comprising:
a heater disposed on the substrate, wherein the heater is configured to heat at least an edge portion of the substrate.

10. The apparatus of claim 1, wherein the substrate includes one or more manifolds in an edge portion of the substrate to provide airflow at the edge portion of the substrate.

11. A system comprising:
a front opening unified pod device; and
a substrate, the substrate including a notched external edge encircling an outside circumference of the substrate, wherein the substrate is configured to receive a cleaning ring, the cleaning ring including a notched internal edge encircling an inside circumference of the cleaning ring, wherein the notched internal edge of the cleaning ring is shaped to fit to the notched external edge of the substrate, wherein the cleaning ring is reversibly attachable to the substrate via the notched external edge of the substrate and the notched internal edge of the cleaning ring, wherein the cleaning ring is formed from a deformable material, wherein the cleaning ring includes a notched external edge including a horizontal surface and a vertical surface, wherein the horizontal surface extends outward from the vertical surface,
wherein the substrate is positionable within the front opening unified pod device.

12. The system of claim 11, wherein the deformable material of the cleaning ring is coated with an adhesive material.

13. The system of claim 11, wherein the substrate has a ring shape.

14. The system of claim 13, wherein the substrate includes a plurality of spokes.

15. The system of claim 11, wherein the substrate has a disk shape.

16. The system of claim 11, wherein the notched internal edge of the cleaning ring corresponds with the notched external edge of the substrate such that a bottom surface of the cleaning ring is flush with a bottom surface of the substrate when the cleaning ring is attached to the substrate.

17. The system of claim 11, wherein the substrate and cleaning ring are sized for compatibility with at least one of the front opening unified pod device or a wafer cassette of a semiconductor fabrication facility.

18. The system of claim 11, further comprising:
an actuator disposed on the substrate, wherein the actuator is configured to produce vibrations within the substrate such that the cleaning ring is actuated at least partially in at least one of a horizontal or vertical direction.

19. The system of claim 11, further comprising:
a heater disposed on the substrate, wherein the heater is configured to heat at least an edge portion of the substrate.

20. The system of claim 11, wherein the substrate includes one or more manifolds in an edge portion of the substrate to provide airflow at the edge portion of the substrate.

* * * * *